United States Patent
Wirz et al.

(10) Patent No.: US 10,879,195 B2
(45) Date of Patent: Dec. 29, 2020

(54) METHOD FOR SUBSTRATE MOISTURE NCF VOIDING ELIMINATION

(71) Applicant: Micron Technology, Inc., Boise, ID (US)

(72) Inventors: Brandon P. Wirz, Boise, ID (US); Benjamin L. McClain, Boise, ID (US); Jeremy E. Minnich, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 46 days.

(21) Appl. No.: 15/898,004

(22) Filed: Feb. 15, 2018

(65) Prior Publication Data

US 2019/0252330 A1    Aug. 15, 2019

(51) Int. Cl.
*H01L 21/60* (2006.01)
*H01L 23/00* (2006.01)
(Continued)

(52) U.S. Cl.
CPC ............ *H01L 23/564* (2013.01); *H01L 21/56* (2013.01); *H01L 21/563* (2013.01);
(Continued)

(58) Field of Classification Search
CPC ...... G01K 7/16; G01K 7/226; G01K 2211/00; G01L 1/2287; H01L 24/16;
(Continued)

(56) References Cited

U.S. PATENT DOCUMENTS 5,693,170 A * 12/1997 Li ............................. G09F 9/33
156/299
5,747,363 A * 5/1998 Wei ........................ H01L 25/167
257/E25.032
(Continued)

OTHER PUBLICATIONS

Michel Biron, in Thermoplastics and Thermoplastic Composites (Third Edition), 2018 chapter 3, "https://www.sciencedirect.conn/science/article/pii/B9780081025017000035" (Year: 2018).*
(Continued)

*Primary Examiner* — Mary A Wilczewski
*Assistant Examiner* — Tsz K Chiu

(57) ABSTRACT

A semiconductor device, semiconductor device assembly, and method of forming a semiconductor device assembly that includes moisture impermeable layer. The assembly includes a first substrate and a second substrate electrically connected to a surface of the first substrate. The assembly includes a layer between the two substrates with the moisture impermeable layer between the layer and the surface of the first substrate. The layer may be non-conductive film, die attach film, capillary underfill, or the like. A portion of the surface of the first substrate may include a solder mask between the moisture impermeable layer and the first substrate. The moisture impermeable layer prevents, or at least inhibits, moisture within the first substrate from potentially creating voids in the layer. The moisture impermeably layer may be a polyimide, a polyimide-like material, an epoxy, an epoxy-acrylate, parylene, vinyltriethoxysilane, or combination thereof. The moisture impermeable layer may have a high electrical resistance.

10 Claims, 4 Drawing Sheets

(51) Int. Cl.
  *H01L 23/29* (2006.01)
  *H01L 23/31* (2006.01)
  *H01L 25/065* (2006.01)
  *H01L 25/00* (2006.01)
  *H01L 21/56* (2006.01)

(52) U.S. Cl.
  CPC ........ *H01L 23/293* (2013.01); *H01L 23/3171* (2013.01); *H01L 25/0657* (2013.01); *H01L 25/50* (2013.01); *H01L 2225/0652* (2013.01)

(58) Field of Classification Search
  CPC ..... H01L 23/49811; H01L 2224/16225; H01L 23/564; H01L 23/49838; H01L 24/14; H01L 2924/14; H01L 2924/181; H01L 2924/014; H01L 2924/01074; H01L 2924/01006; H01L 2924/01005; H01L 2924/15311; H01L 2924/01079; H01L 2924/01038; H01L 2924/01033; H01L 2924/01032; H01L 2924/01029; H01L 2924/01013; H01L 2224/13099; H01L 23/49827; H01L 23/49816; G01N 27/127
  See application file for complete search history.

(56) References Cited

U.S. PATENT DOCUMENTS

| | | | | |
|---|---|---|---|---|
| 5,796,170 A * | 8/1998 | Marcantonio | ........... | H01L 23/24 257/691 |
| 5,866,953 A * | 2/1999 | Akram | ........... | H01L 21/563 257/687 |
| 6,590,287 B2 * | 7/2003 | Ohuchi | ........... | H01L 21/563 228/180.22 |
| 9,355,951 B2 * | 5/2016 | Kao | ........... | H01L 23/49838 |
| 9,368,458 B2 * | 6/2016 | Wu | ........... | H01L 23/10 |
| 9,383,880 B2 * | 7/2016 | Aoki | ........... | G06F 3/044 |
| 9,466,548 B2 * | 10/2016 | Sakamoto | ........... | H01L 23/3107 |
| 9,818,706 B2 * | 11/2017 | Kertesz | ........... | H01L 24/86 |
| 2001/0015488 A1 * | 8/2001 | Akram | ........... | H05K 1/144 257/686 |
| 2002/0033525 A1 * | 3/2002 | Ohuchi | ........... | H01L 21/563 257/679 |
| 2002/0068453 A1 * | 6/2002 | Grigg | ........... | H01L 21/563 438/690 |
| 2003/0201462 A1 * | 10/2003 | Pommer | ........... | G02B 6/4201 257/200 |
| 2004/0251045 A1 * | 12/2004 | Wu | ........... | H01L 27/3288 174/250 |
| 2006/0042078 A1 * | 3/2006 | Takeuchi | ........... | H05K 1/186 29/830 |
| 2007/0117264 A1 * | 5/2007 | Masumoto | ........... | H01L 21/563 438/108 |
| 2007/0164457 A1 * | 7/2007 | Yamaguchi | ........... | H01L 23/5389 257/787 |
| 2008/0017409 A1 * | 1/2008 | Takeuchi | ........... | H05K 1/186 174/260 |
| 2013/0109136 A1 * | 5/2013 | Foote | ........... | H01L 24/83 438/115 |
| 2018/0068912 A1 * | 3/2018 | Hsin | ........... | H01L 23/16 |
| 2018/0231484 A1 * | 8/2018 | Duchesne | ........... | H01L 23/49811 |

OTHER PUBLICATIONS

Brok et al., "Inkjet-based additive manufacturing addresses challenges in semiconductor packaging" Chip Scale Review, Mar. 2017.
Zhao, Jack and Getty, James D., "Plasma for Undertill Process in Flip Chip Packaging" Nordson, Mar. 2015.

* cited by examiner

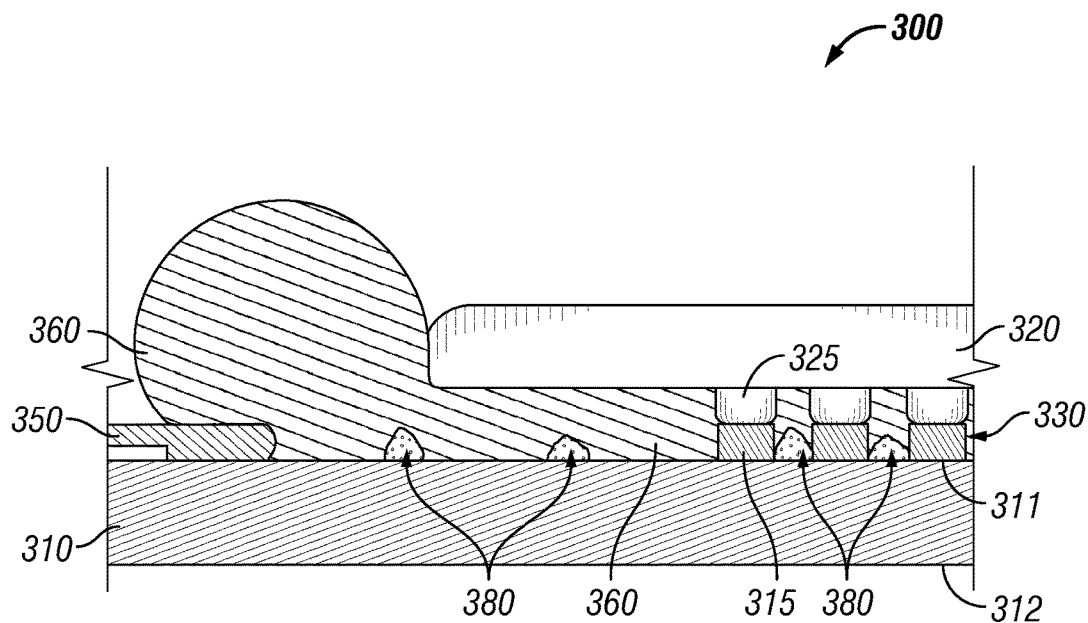
FIG. 3
*(Prior Art)*
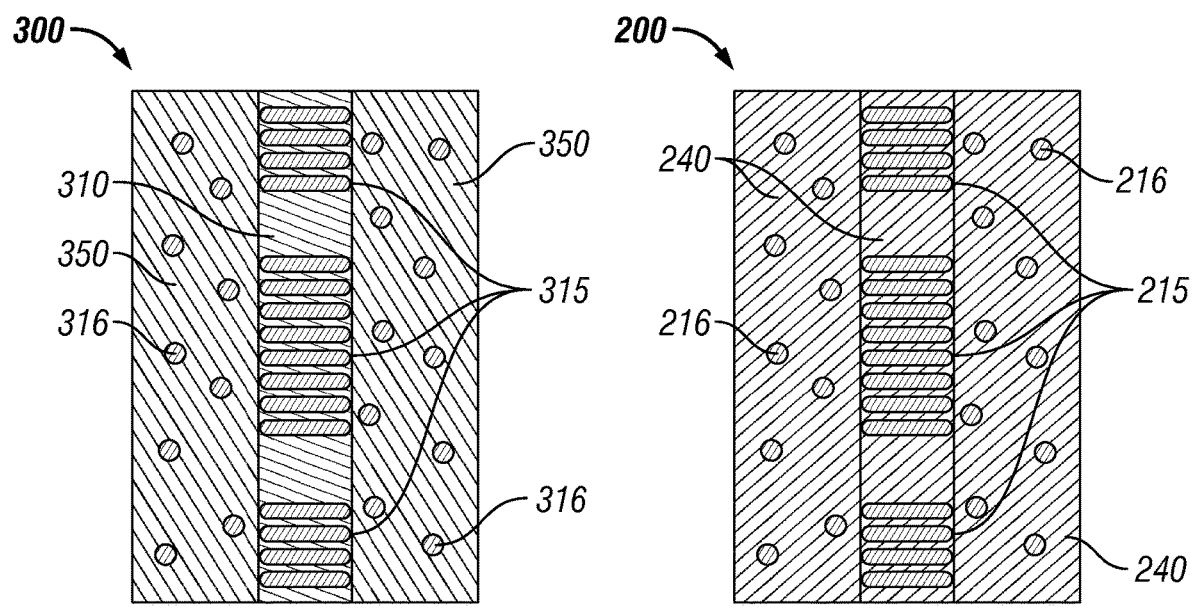
FIG. 4
*(Prior Art)*
FIG. 5

METHOD FOR SUBSTRATE MOISTURE NCF VOIDING ELIMINATION

FIELD

The embodiments described herein relate to semiconductor device assemblies having a moisture impermeable layer and methods of providing such semiconductor device assemblies.

BACKGROUND

Semiconductor device assemblies, including, but not limited to, memory chips, microprocessor chips, and imager chips, typically include a semiconductor device, such as a die, mounted on a substrate. The semiconductor device assembly may include various functional features, such as memory cells, processor circuits, and imager devices, and may include bond pads that are electrically connected to the functional features of the semiconductor device assembly. The semiconductor device assembly may include semiconductor devices stacked upon and electrically connected to one another by individual interconnects between adjacent devices within a package.

Various methods and/or techniques may be employed to support adjacent dies and/or substrates in a semiconductor device assembly. For example, thermal compression bonding with non-conductive film (NCF) may be used. As an example, the NCF may be a laminated sheet of film deposited onto a substrate. One potential disadvantage is the presence of voids within the NCF. FIG. 3 shows a semiconductor device assembly 300 that includes a second substrate, or semiconductor device, 320 bonded to a first substrate 310. The second substrate 320 is electrically connected to the first substrate 310 via interconnects 330 comprised of pillars 325 connected to electrical traces 315 as would be appreciated by one of ordinary skill in the art. A single second substrate 320 is shown in FIG. 3 connected to the first substrate 310 for illustrative purposes. However, the semiconductor device assembly 300 may include more than one additional substrate 320 as would be appreciated by one of ordinary skill in the art having the benefit of this disclosure.

The semiconductor device assembly 300 includes a solder mask 350 and NCF 360 positioned between the second substrate 320 and a first or top surface 311 of the first substrate 310, which is opposite a second or bottom surface 312. The semiconductor device assembly 300 includes voids 380 within the NCF 360. The voids 380 may have been created due to moisture within the first substrate 310 moving up to the bond line between the first substrate 310 and the second substrate 320. Semiconductor device assemblies 300 are typically assembled in a high humidity environment, which helps to decrease the possibility of electrostatic discharge. The high humidity environment causes the first substrate 310 to absorb moisture once the first substrate 310 is removed from the packaging. The absorbed moisture may move up to the bond line during the assembly process potentially causing voids 380 in the NCF 360.

One method to eliminate voids 380 within the NCF 360 is to bake the first substrate 310 for a substantial period, for example for two (2) to three (3) hours, to remove the moisture from the first substrate 310 prior to assembly with the second substrate 320, which may be a semiconductor device such as a die. This process increases the overall cost and time required to assemble a semiconductor device assembly 300. Additionally, the first substrate 310 begins to absorb moisture once it exits the baking process requiring the second substrate 320 to be connected to the first substrate 310 in a short time period after the baking process. For example, the first substrate 310 may absorb too much moisture if not assembled with the second substrate 320 within eight (8) hours of the baking process.

Thermo-compression bonding (TCB) using flux and capillary underfill ("Flux/CUF") as a material is another technique that may be used to attach a die to a substrate to create a semiconductor device assembly. The flux may be flux jetted onto a substrate and then a semiconductor device may be attached to the substrate using a TCB process. Afterwards, capillary underfill (CUF) may be dispensed next to the semiconductor bond line so that the capillary effect pulls the CUF into the bond line until it is full. Absorbed moisture within the substrate may move up to the bond line during the assembly process potentially causing voids in the CUF. Die attach film (DAF) may be used to facilitate attaching a die to a substrate. Absorbed moisture within the substrate may move up to the bond line during the assembly process potentially causing voids in the DAF.

Additional drawbacks and disadvantages may exist.

BRIEF DESCRIPTION OF THE DRAWINGS

FIG. 3 is a schematic cross-section view of a prior art semiconductor device assembly.

FIG. 4 is a schematic top view of a prior art substrate.

FIG. 5 is a schematic top view of a substrate having a moisture impermeable layer.

Figure 1:
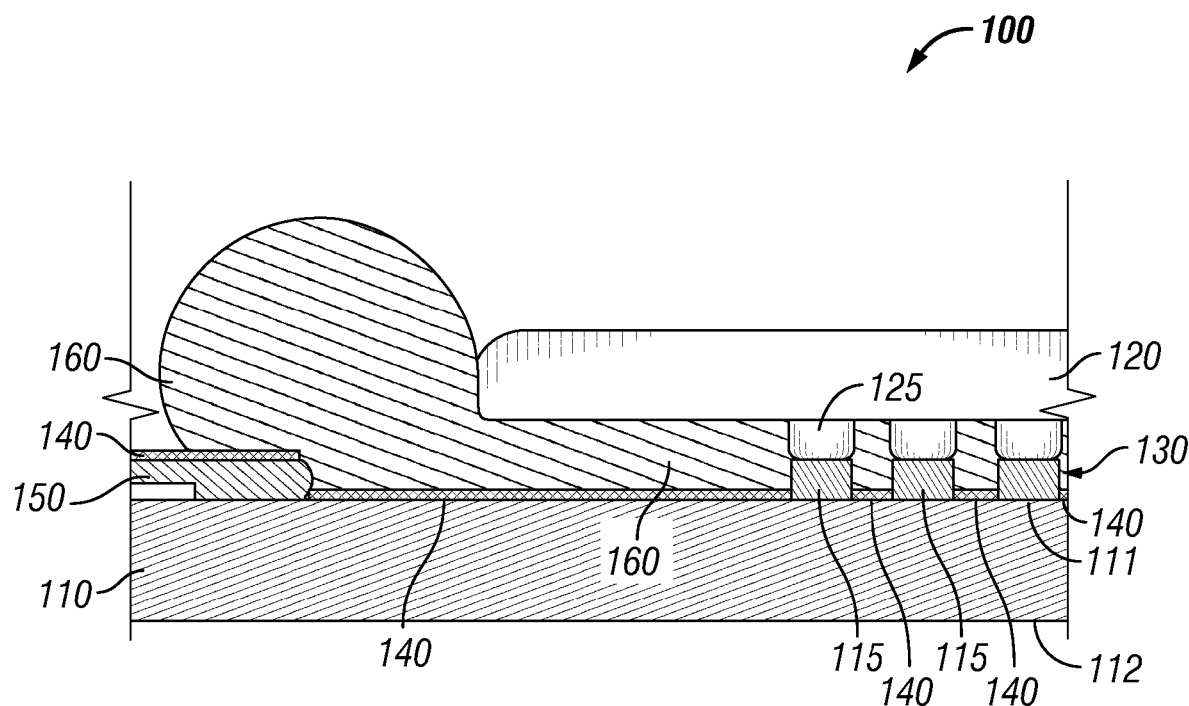
FIG. 1 is a schematic cross-section view of an embodiment of a semiconductor device assembly having a moisture impermeable layer.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies.

As used herein, the terms "vertical," "lateral," "upper," "lower," "up," "down," "top," "bottom," or the like can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, and methods of making and/or operating semiconductor devices. In one embodiment of the disclosure, a semiconductor device assembly comprises a first substrate, a second substrate electrically connected to a surface of the first substrate, and a layer between the surface of the first substrate and the second substrate. The layer may be NCF, CUF, DAF, or the like. The semiconductor device assembly includes a moisture impermeable layer positioned between the layer and the surface of the first substrate, wherein the moisture impermeable layer ideally prohibits, but at least inhibits or resists moisture within the first substrate from moving through the moisture impermeable layer.

In one embodiment of the disclosure, a semiconductor device comprises a substrate, a plurality of pads extending from a surface of the substrate, and a plurality of electrical traces on the surface of the substrate. A pad may refer to any point on a substrate that will connect to a pillar on an adjacent substrate as would be appreciated by one of ordinary skill in the art having the benefit of this disclosure. The semiconductor device includes a moisture impermeable layer on a portion of the surface of the substrate, wherein the moisture impermeable layer is absent from the plurality of pads and the plurality of the plurality of electrical traces. In one embodiment of the disclosure, a method of making a semiconductor device assembly comprises providing a first substrate and depositing a moisture impermeable layer on a portion of a first surface of the first substrate, wherein the moisture impermeable layer prevents, or at least resists, moisture within the first substrate from moving past the moisture impermeable layer. The method includes providing a layer on the moisture impermeable layer and attaching a second substrate to the first surface of the substrate with the layer and the moisture impermeable layer being positioned between the two substrates. The layer may be NCF, DAF, CUF, or the like. The layer, which may be NCF, may be provided on the moisture impermeable layer in various ways as would be appreciated by one of ordinary skill in the art having the benefit of this disclosure. For example, NCF may be laminated onto the semiconductor device. In an embodiment, NCF may not be laminated onto the substrate until after additional substrates are stacked onto the substrate.

FIG. 1 shows a semiconductor device assembly 100 that includes a second substrate, or semiconductor device, 120 attached or bonded to a first substrate 110. The second substrate 120 is electrically connected to the first substrate 110 via interconnects 130 comprised of pillars 125 on the second substrate 120 connected to electrical traces 115 on the first substrate 110. A single second substrate 120 is shown in FIG. 1 connected to the first substrate 110 for illustrative purposes. However, the semiconductor device assembly 100 may include more than one additional substrate 120 as would be appreciated by one of ordinary skill in the art having the benefit of this disclosure.

The semiconductor device assembly 100 includes a solder mask 150 and a layer, which may be NCF 160, positioned between the second substrate 120 and a first or top surface 111 of the first substrate 110, which is opposite a second or bottom surface 112. The semiconductor device assembly 100 includes a moisture impermeable layer 140 that is positioned on top of a portion of the surface 111 of the first substrate 110 and on the solder mask 150. The moisture impermeable layer 140 is configured to prevent, or at least inhibit or deter, moisture within the first substrate 110 from moving past the impermeable layer 140 and into the NCF 160, which could result in voids 380 (shown in FIG. 3). The moisture impermeably layer 140 is configured to prevent, or at least inhibit or deter, moisture within the first substrate 110 from moving past the impermeable layer 140 and into the layer 160, whether the layer comprises NCF, DAF, CUF, or the like. In an embodiment, the moisture impermeable layer 140 may be deposited on exposed portions of the first substrate 110 that are not already covered by the solder mask 150, as would be appreciated by one of ordinary skill in the art having the benefit of this disclosure. For example, the moisture impermeable layer 140 may be deposited on all exposed areas of the first substrate 110 and then be removed from exposed electrical connection areas (e.g., traces 115). Alternatively, the moisture impermeable layer 140 may only be deposited on exposed areas of the first substrate 110 that do not include exposed electrical connections.

Figure 6A:
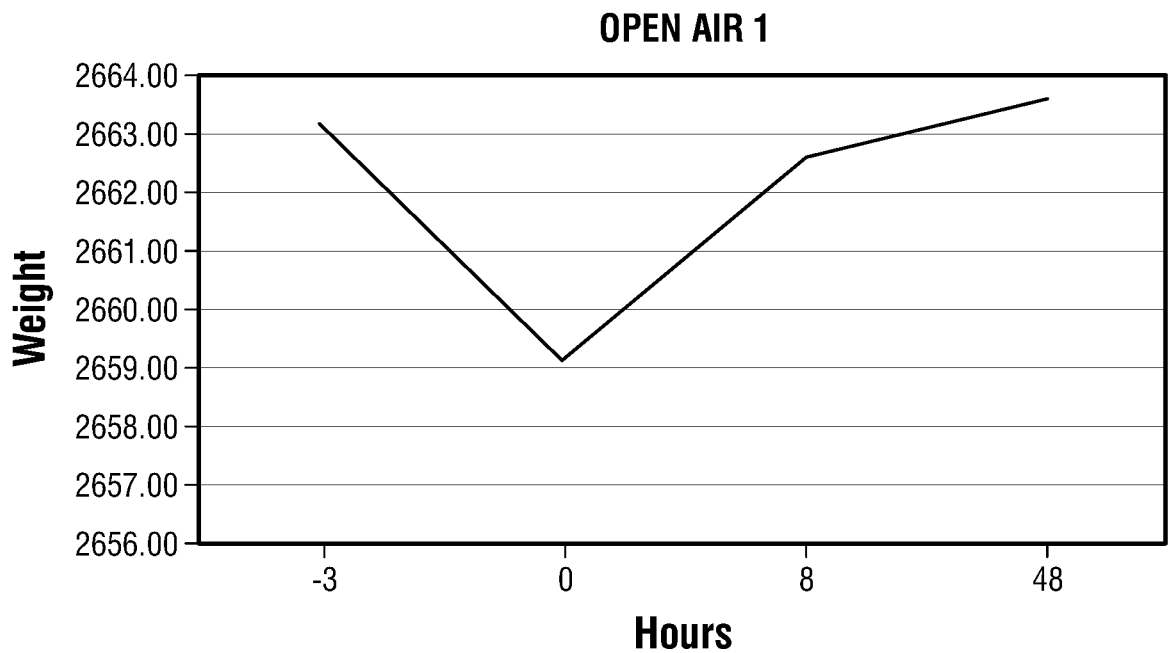
FIG. 6A is a graph showing the moisture absorption rate of a substrate.
Figure 6B:
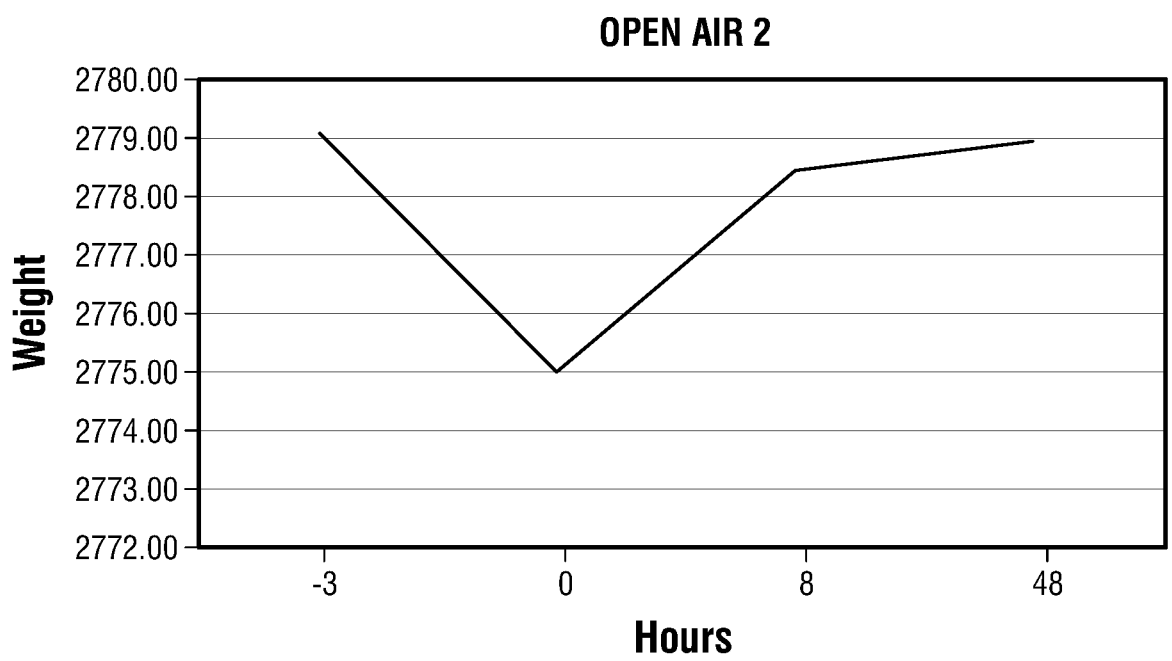
FIG. 6B is a graph showing the moisture absorption rate of a substrate.

As discussed herein, semiconductor device assemblies 100 may be typically assembled in a high humidity environment, which helps to decrease the possibility of electrostatic discharge. However, the substrate begins to absorb moisture in the high humidity environment once the substrate is removed from its packaging, as shown in FIGS. 6A and 6B. FIG. 6A is a graph depicting the weight of a first example substrate. From time −3 hours to 0 hours, the weight of the substrate decreases as the moisture is removed during the baking process. At time 0 hours, the first example substrate is removed from a baking process and left in the open air. As shown in FIG. 6A, the first example substrate immediately begins to absorb moisture, which causes an increase in weight. Within eight (8) hours of being in open air, the first example substrate has absorbed almost all of the moisture removed during the baking process. FIG. 6B is a graph depicting the weight of a second example substrate. Again, the graph shows that the second example substrate begins to absorb moisture once it is removed from the baking process and within eight (8) hours the substrate has absorbed almost all of the moisture previously removed by the baking process.

The moisture impermeable layer 140 may be a thin layer added to the first substrate 110 to prohibit, or at least inhibit, moisture within the first substrate 110 from creating voids within the NCF 160, or the like, of the semiconductor device assembly 100. For example, the moisture impermeable layer 140 may have a thickness between 15μ and 1μ, or even less. The moisture impermeable layer 140 may be comprised of various materials as would be appreciated by one of ordinary skill in the art having the benefit of this disclosure. For example, the moisture impermeable layer 140 may be comprised of, but not limited to, polyimides, polyimide-like materials, epoxies, epoxy-acrylates, polymers, parylene, vinyltriethoxysilane, and/or combinations thereof. The moisture impermeable layer 140 may be used on a substrate 110 to prohibit, or at least inhibit, moisture within the substrate 110 from creating voids within CUF, DAF, or the like, as would be appreciated by one of ordinary skill in the art having the benefit of this disclosure.

The moisture impermeable layer 140 may be deposited onto the solder mask 150 and surface 111 of the first substrate 110 in various different ways as would be appreciated by one of ordinary skill in the art having the benefit of this disclosure. For example, the moisture impermeable layer 140 may be printed onto the solder mask 150 and substrate 110 by a 3D printer, such as a 3D ink jet printer. The moisture impermeable layer 140 may be printed onto those areas of the first substrate 110 desired to be covered by the moisture impermeable layer 140. The moisture impermeable layer 140 may be deposited onto the first substrate 110 in various ways. For example, screen printing may be used to deposit the moisture impermeable layer 140. The moisture impermeably layer 140 could be added to the entire surface 111 of the first substrate 110 including the solder mask 150 and then be removed from the exposed traces 115, as well as any exposed pads, as would be appreciated by one of ordinary skill in the art having the benefit of this disclosure.

The moisture impermeable layer 140 may be treated to improve the wetting and adherence between the NCF 160, or the like, and the moisture impermeable layer 140. For example, the moisture impermeable layer 140 may be comprised of a low surface energy material, such as parylene. The moisture impermeable layer 140 may be treated prior to the application of the NCF 160, or the like, to improve the adherence of the NCF 160, or the like, to the moisture impermeable layer 140. The moisture impermeable layer 140 may be treated in various ways to improve the wetting and adherence as would be appreciated by one of ordinary skill in the art having the benefit of this disclosure. For example, the moisture impermeable layer 140 may be treated by the application of plasma to the moisture impermeable layer 140.

Figure 2:
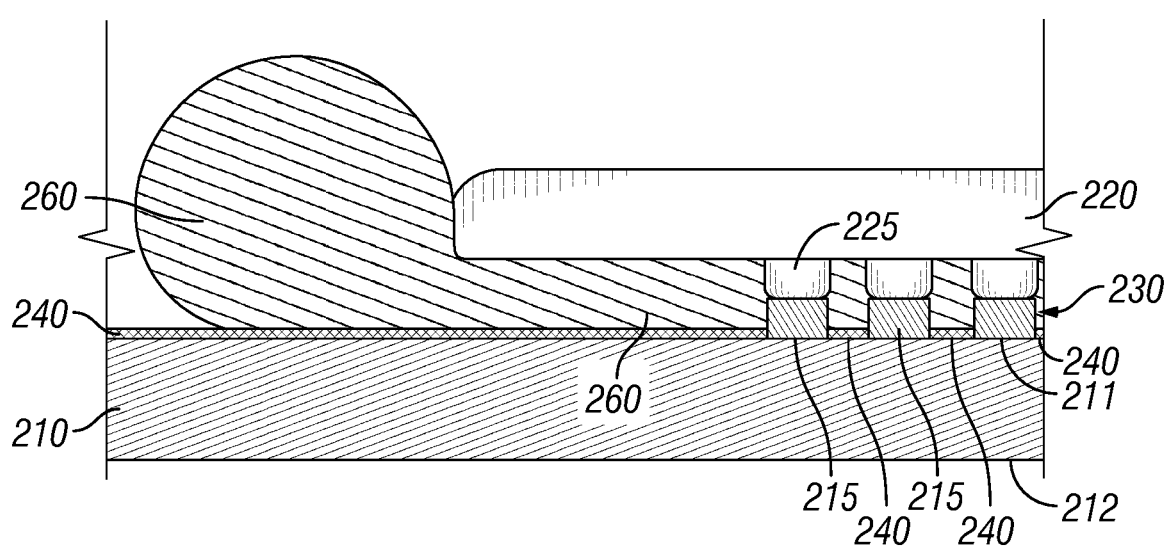
FIG. 2 is a schematic cross-section view of an embodiment of a semiconductor device assembly having a moisture impermeable layer.

FIG. 2 shows a semiconductor device assembly 200 that includes a second substrate, or semiconductor device, 220 attached or bonded to a first substrate 210. The second substrate 220 is electrically connected to the first substrate 210 via interconnects 230 comprised of pillars 225 on the second substrate 220 connected to electrical traces 215 on the first substrate 210. A single second substrate 220 is shown in FIG. 2 connected to the first substrate 210 for illustrative purposes. However, the semiconductor device assembly 200 may include more than one additional substrate 220 as would be appreciated by one of ordinary skill in the art having the benefit of this disclosure.

The semiconductor device assembly 200 includes NCF 260, or the like, positioned between the second substrate 220 and a first or top surface 211 of the first substrate 210, which is opposite a second or bottom surface 212. The semiconductor device assembly 200 includes a moisture impermeable layer 240 that is positioned on top of a portion of the surface 211 of the first substrate 210. The moisture impermeable layer 140 is configured to prevent, or at least inhibit, moisture within the first substrate 210 from moving past the impermeable layer 240 and into the NCF 260, which could result in voids 380 (shown in FIG. 3). The moisture impermeable layer 240 may be used on a substrate 210 to prohibit, or at least inhibit, moisture within the substrate 210 from creating voids within CUF, DAF, or the like, as would be appreciated by one of ordinary skill in the art having the benefit of this disclosure.

The moisture impermeable layer 240 may be used as a substitute for the solder mask 150 of the semiconductor device assembly 100 of FIG. 1. The moisture impermeable layer 240 may be a thin layer added to the first substrate 240 to prevent or resist moisture within the first substrate 240 from creating voids within the NCF 260, or the like, of the semiconductor device assembly 200. The moisture impermeable layer 240 may decrease impingement issues as would be appreciated by one of ordinary skill in the art having the benefit. For example, the moisture impermeable layer 140 may have a thickness of between 15μ and 1μ, or even less, which may be thinner than a solder mask 150 (shown in FIG. 1) as solder masks 150 are typically 20μ thick.

As discussed herein, the moisture impermeable layer 240 may be comprised of various materials as would be appreciated by one of ordinary skill in the art having the benefit of this disclosure. For example, the moisture impermeable layer 240 may be comprised of, but not limited to, polyimides, polyimide-like materials, epoxies, epoxy-acrylates, polymers, parylene, vinyltriethoxysilane, and/or combinations thereof. The moisture impermeable layer 240 may be treated to improve the wetting and adherence between the NCF 260, or the like, and the moisture impermeable layer 240.

FIG. 4 shows a top view schematic of a prior semiconductor assembly 300. The second substrate 320 is not shown for clarity. The first substrate 310 includes a plurality of pads 316 and exposed traces 315 shown schematically in FIG. 4. A solder mask 350 covers a left portion and right portion of the top surface of the first substrate 310. The solder mask 350 is not deposited onto the pads 316 or a central exposed portion of the first substrate 310 that include exposed traces 315.

FIG. 5 shows a top view schematic of an embodiment of a semiconductor assembly 200. The second substrate 220 is not shown for clarity. The first substrate 210 includes a plurality of pads 216 and traces 215. A moisture impermeable layer 240 covers the surface of the first substrate 210. The moisture impermeable layer 240 does not cover the pads 216 or exposed electrical traces 215 in a center portion of the first substrate 210. As discussed herein, the moisture impermeable layer 240 is configured to prevent or at least resist moisture within the first substrate 210 from moving past the impermeable layer 240, which could result in voids 380 (shown in FIG. 3) in NCF 260 (not shown in FIG. 5) between the first substrate 210 and a second substrate 220 (not shown in FIG. 5). The moisture impermeable layer 240 may be configured to prevent or at least resist moisture within a substrate 210 from moving past the impermeable layer 240, which could result in voids within CUF, DAF, or the like, as would be appreciated by one of ordinary skill in the art having the benefit of this disclosure.

The moisture impermeable layer 240 may be deposited onto the first substrate 210 in various different ways as would be appreciated by one of ordinary skill in the art having the benefit of this disclosure. For example, the moisture impermeable layer 240 may be printed onto the substrate 210 by a 3D printer, such as a 3D ink jet printer. The moisture impermeable layer 240 may be deposited onto the first substrate 210 in various ways. The moisture impermeably layer 240 could be added to the entire surface 211 of the first substrate 210 and then be removed from the pads 216 and the exposed traces 215 as would be appreciated by one of ordinary skill in the art having the benefit of this disclosure.

Figure 7:
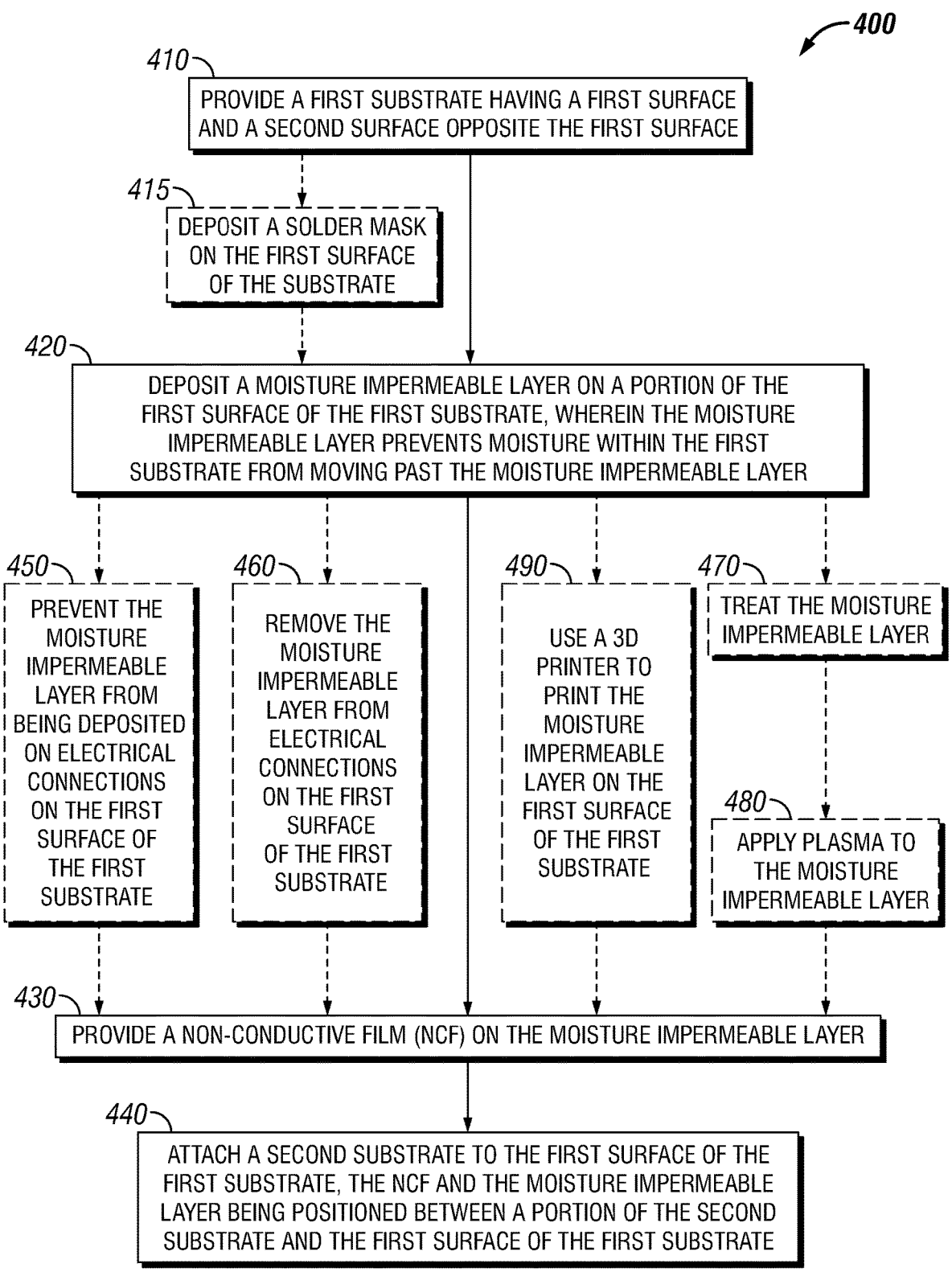
FIG. 7 is a flow chart depicting one embodiment of a method of making a semiconductor device assembly.

FIG. 7 is a flow chart of an embodiment of a method 400 of making a semiconductor device assembly. The method 400 includes providing a first substrate having a first surface and a second surface opposite the first surface, at 410. The method 400 includes depositing a moisture impermeable layer on a portion of the first surface of the first substrate, wherein the moisture impermeable layer prevents, or at least inhibits, moisture within the first substrate from moving past the moisture impermeable layer, at 420. The method 400 may include deposing a solder mask on the first surface of the first substrate, at 415, prior to depositing the moisture impermeable layer. The moisture impermeable layer would then be deposited on both the solder mask and the first surface of the first substrate.

The method 400 includes providing NCF, DAF, CUF, or the like, on the moisture impermeable layer, at 430, and attaching a second substrate to the first surface of the first substrate with the NCF and the moisture impermeable layer being positioned between a portion of the second substrate and the first surface of the first substrate, at 440. Alternatively, NCF, or the like, may be laminated onto a semiconductor device assembly after the second substrate, and potentially additional substrates, are stacked onto the first substrate as would be appreciated by one of ordinary skill in the art having the benefit of this disclosure. The method 400 may include preventing the moisture impermeable layer from being deposited on electrical connections on the first surface of the first substrate, at 450. The method 400 may include removing the moisture impermeable layer from electrical connections on the first surface of the first substrate, at 460.

The method 400 may include treating the moisture impermeable layer, at 470. The moisture impermeable layer may be treated to improve the wettability and/or adherence by NCF when it is deposited on the moisture impermeable layer. The method 400 may include applying plasma to the moisture impermeable layer, at 480. Other methods may be used to treat the moisture impermeable layer as would be appreciated by one of ordinary skill in the art having the benefit of this disclosure. The method 400 may include using a 3D printer to print the moisture impermeable layer on the first surface of the first substrate, at 490. Other methods may be used to deposit the moisture impermeable layer on the first surface of the first substrate as would be appreciated by one of ordinary skill in the art having the benefit of this disclosure.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A semiconductor device assembly comprising:
   a first substrate;
   a second substrate electrically connected to a surface of the first substrate via a plurality of interconnects, the plurality of interconnects extend from the second substrate to the surface of the first substrate;
   a non-conductive layer positioned between the surface of the first substrate and the second substrate;
   a solder mask on a portion of the surface of the first substrate; and
   a moisture impermeable layer positioned on the surface of the first substrate, the moisture impermeable layer being between the non-conductive layer and the surface of the first substrate and a portion of the moisture impermeable layer being positioned between the solder mask and the non-conductive layer, wherein a portion of the moisture impermeable layer is positioned between the plurality of interconnects and wherein the non-conductive layer extends from the moisture impermeable layer to the second substrate and wherein the moisture impermeable layer resists moisture within the first substrate from moving through the moisture impermeable layer and into the layer.

2. The assembly of claim 1, the non-conductive layer comprising nonconductive film (NCF).

3. The assembly of claim 1, the non-conductive layer comprising die attach film.

4. The assembly of claim 1, the non-conductive layer comprising capillary underfill.

5. The assembly of claim 1, the first substrate further comprising at least one pad and at least one electrical trace, wherein the moisture impermeable layer is absent from the surface of the substrate at the at least one pad and at the at least one electrical trace.

6. The assembly of claim 1, wherein the moisture impermeable layer has a thickness between 1μ and 15μ.

7. The assembly of claim 1, wherein the moisture impermeable layer is comprised of one of polyimides, polyimide-like materials, epoxies, epoxy-acrylates, polymers, parylene, vinyltriethoxysilane, and combinations thereof.

8. The assembly of claim 1, wherein the moisture impermeable layer has an electrical resistance equal to or higher than $10^{12}$ ohm-centimeter.

9. The assembly of claim 1, wherein the moisture impermeable layer has been treated to improve wetting and adherence of the layer to the moisture impermeable layer.

10. The assembly of claim 1, wherein the second substrate comprises a semiconductor die.

* * * * *